United States Patent
Chen et al.

(10) Patent No.: US 11,988,559 B2
(45) Date of Patent: May 21, 2024

(54) COLOR CALIBRATOR

(71) Applicant: QISDA CORPORATION, Taoyuan (TW)

(72) Inventors: Chun-Jung Chen, Taoyuan (TW); Yung-Yeh Chang, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 735 days.

(21) Appl. No.: 17/148,482

(22) Filed: Jan. 13, 2021

(65) Prior Publication Data
US 2021/0215538 A1 Jul. 15, 2021

(30) Foreign Application Priority Data
Jan. 14, 2020 (TW) .................................. 109101181

(51) Int. Cl.
*H05K 5/02* (2006.01)
*G01J 3/02* (2006.01)
*G01J 3/50* (2006.01)
*G06F 1/16* (2006.01)
*G09G 5/02* (2006.01)

(52) U.S. Cl.
CPC ............. *G01J 3/506* (2013.01); *G01J 3/0202* (2013.01); *G01J 3/0291* (2013.01); *G06F 1/16* (2013.01); *H05K 5/0217* (2013.01); *G09G 5/02* (2013.01); *G09G 2320/0242* (2013.01); *G09G 2320/0693* (2013.01)

(58) Field of Classification Search
CPC ........ G01J 3/506; G01J 3/0202; G01J 3/0291; G01J 3/0237; G06F 1/16; G06F 1/1607; G06F 3/147; H05K 5/0217; G09G 5/02; G09G 2320/0242; G09G 2320/0693
See application file for complete search history.

(56) References Cited

U.S. PATENT DOCUMENTS

| | | | | |
|---|---|---|---|---|
| 6,233,138 B1* | 5/2001 | Osgood | ................. | G06F 1/1679 248/920 |
| 8,201,340 B2* | 6/2012 | Steffensen | ............. | G01C 15/06 33/809 |
| 10,937,386 B2 | 3/2021 | Huang | | |
| 11,049,435 B2 | 6/2021 | Fan | | |
| 2008/0204437 A1* | 8/2008 | Jensen | ...................... | G01J 1/32 345/207 |

FOREIGN PATENT DOCUMENTS

| | | |
|---|---|---|
| CN | 108510931 A | 9/2018 |
| CN | 109883552 A | 6/2019 |
| TW | 1677246 B | 11/2019 |

* cited by examiner

*Primary Examiner* — Anthony Q Edwards
*Assistant Examiner* — Hung Q Dang

(57) ABSTRACT

A color calibrator includes a first casing, a second casing and an optical sensor. The first casing has an accommodating recess and a plurality of first positioning members, wherein the first positioning members are arranged along an axial direction of the accommodating recess. The second casing is telescopically disposed in the accommodating recess. The second casing has a second positioning member. One of the first positioning member and the second positioning member is a magnet. Another one of the first positioning member and the second positioning member is a magnet or a magnetic induction material. The second positioning member cooperates with one of the first positioning members to position the second casing at one of a plurality of telescopic positions with respect to the first casing. The optical sensor is disposed on the second casing.

21 Claims, 14 Drawing Sheets

COLOR CALIBRATOR

BACKGROUND OF THE INVENTION

1. Field of the Invention

The invention relates to a color calibrator and, more particularly, to a color calibrator capable of adjusting a length according to a size of a display device.

2. Description of the Prior Art

A color calibrator utilizes a colorimeter to detect a color error of a display device and then generates a setting profile for modifying the color error. As long as the setting profile is applied to the display device, the display device can display colors close to standard. In general, when a detection position of the color calibrator is closer to a center of the display device, the color calibration is more accurate. At present, a length of the color calibrator cannot be adjusted. Accordingly, when a size of the display device is larger, the detection position of the color calibrator is farther away from the center of the display device, such that the accuracy of color calibration is reduced.

SUMMARY OF THE INVENTION

An objective of the invention is to provide a color calibrator capable of adjusting a length according to a size of a display device, so as to solve the aforesaid problems.

According to an embodiment of the invention, a color calibrator comprises a first casing, a second casing and an optical sensor. The first casing has an accommodating recess and a plurality of first positioning members, wherein the first positioning members are arranged along an axial direction of the accommodating recess. The second casing is telescopically disposed in the accommodating recess. The second casing has a second positioning member. One of the first positioning member and the second positioning member is a magnet. Another one of the first positioning member and the second positioning member is a magnet or a magnetic induction material. The second positioning member cooperates with one of the first positioning members to position the second casing at one of a plurality of telescopic positions with respect to the first casing. The optical sensor is disposed on the second casing.

As mentioned in the above, a user may slide the second casing of the color calibrator to one of the telescopic positions with respect to the first casing by means of the cooperation between the first positioning members and the second positioning member, so as to adjust a length of the color calibrator according to a size of a display device. When the user hangs the first casing of the color calibrator on an edge of the display device, the optical sensor of the color calibrator can sense a color of a center of the display device. Accordingly, the color calibrator of the invention can be adapted to various display devices with different sizes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
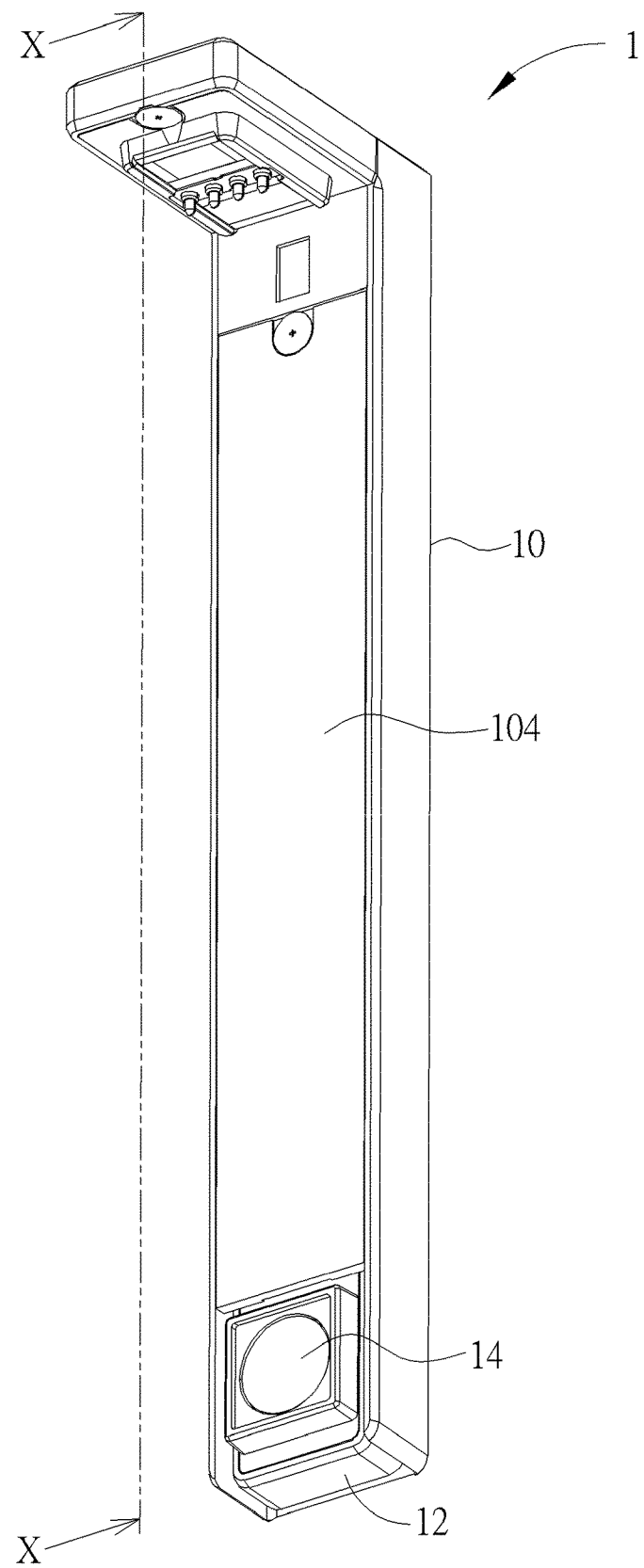
FIG. 1 is a perspective view illustrating a color calibrator according to an embodiment of the invention.
Figure 2:
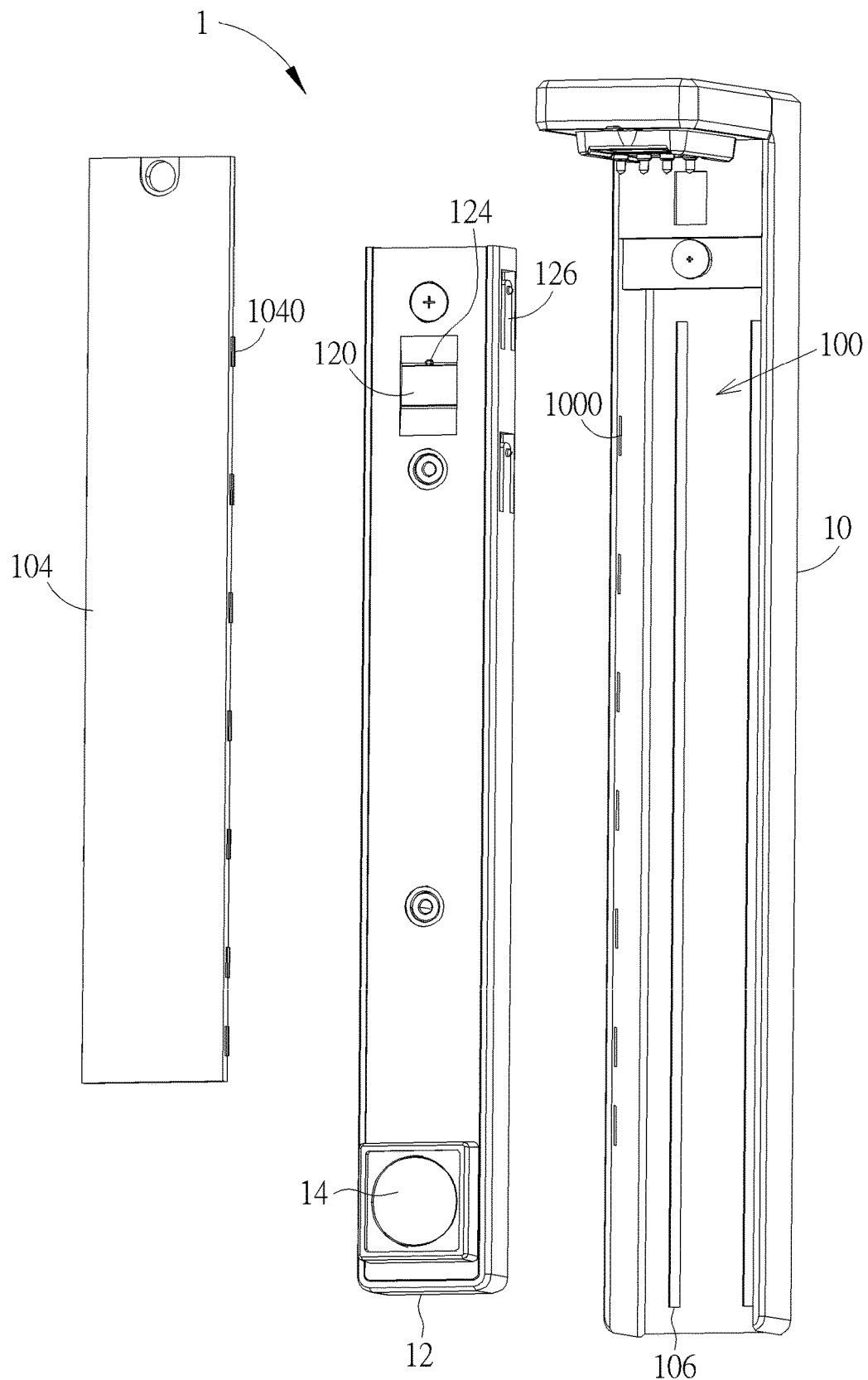
FIG. 2 is an exploded view illustrating the color calibrator shown in FIG. 1.
Figure 3:
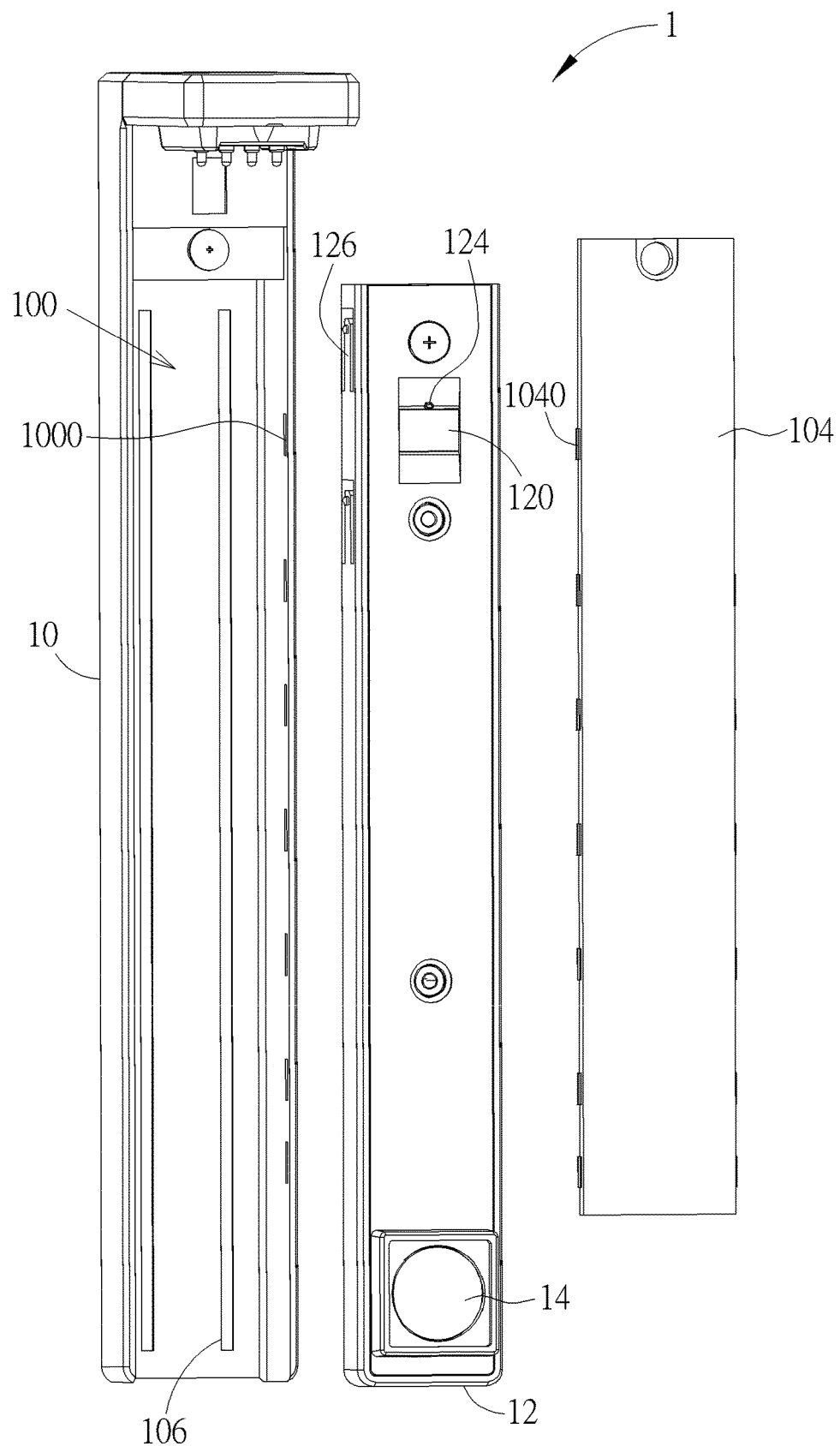
FIG. 3 is an exploded view illustrating the color calibrator shown in FIG. 1 from another viewing angle.
Figure 4:
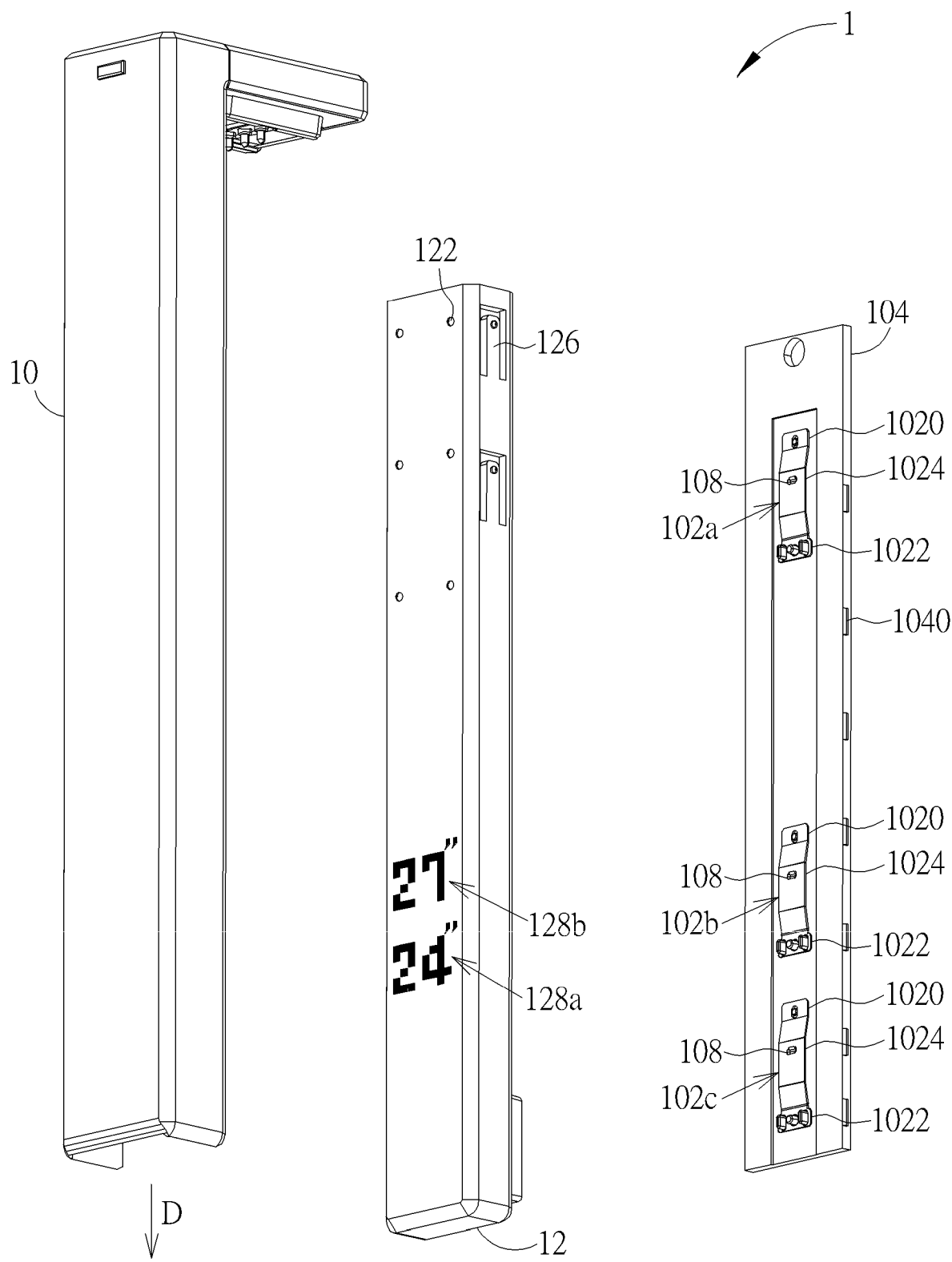
FIG. 4 is an exploded view illustrating the color calibrator shown in FIG. 1 from another viewing angle.
Figure 5:
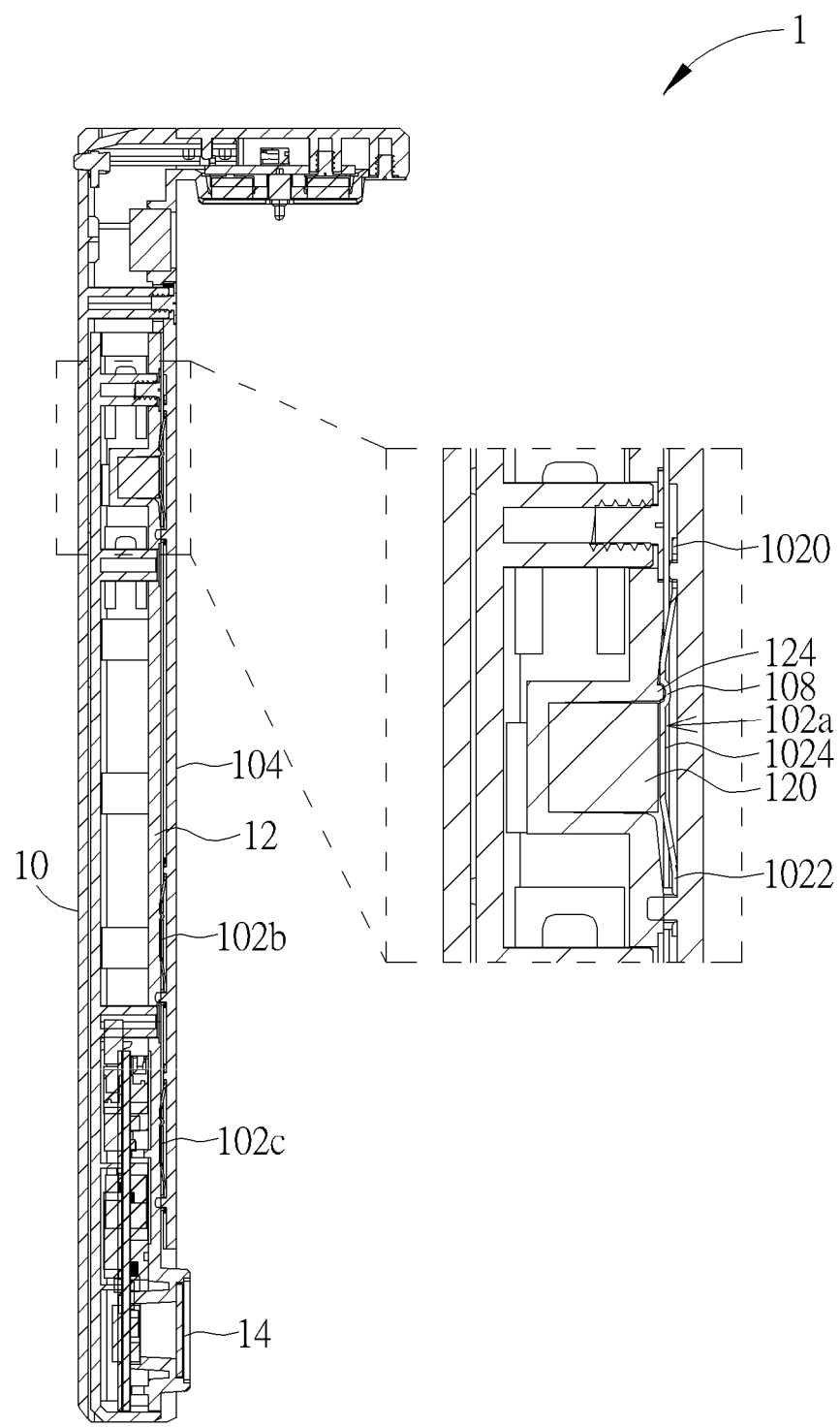
FIG. 5 is a sectional view illustrating the color calibrator shown in FIG. 1.
Figure 6:
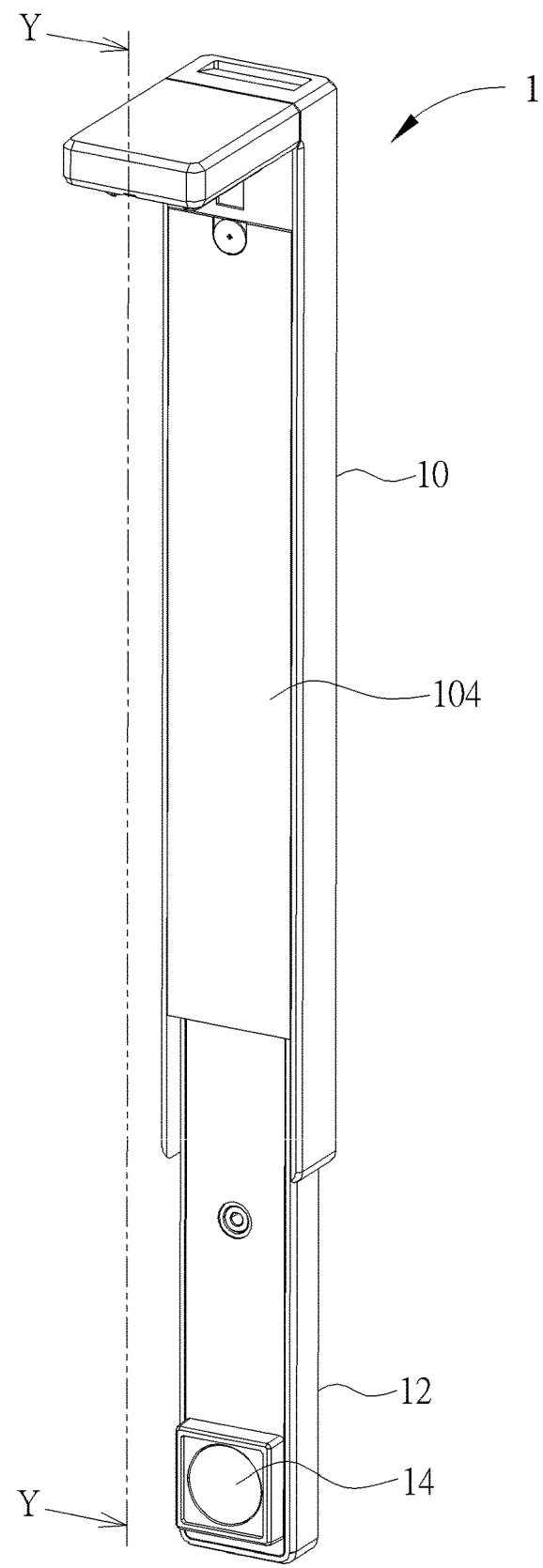
FIG. 6 is a perspective view illustrating that the second casing shown in FIG. 1 protrudes from the first casing.
Figure 7:
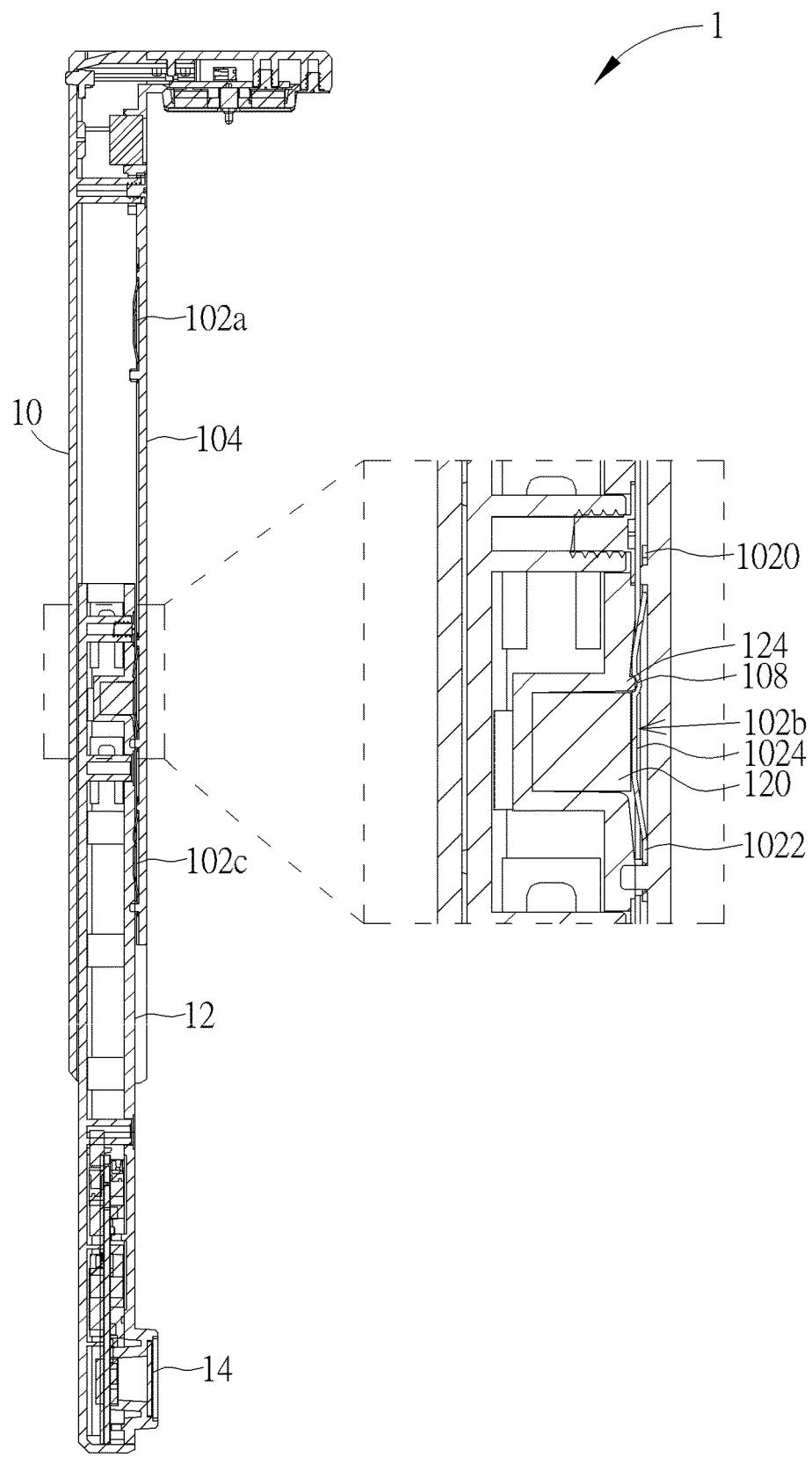
FIG. 7 is a sectional view illustrating the color calibrator shown in FIG. 6.
Figure 8:
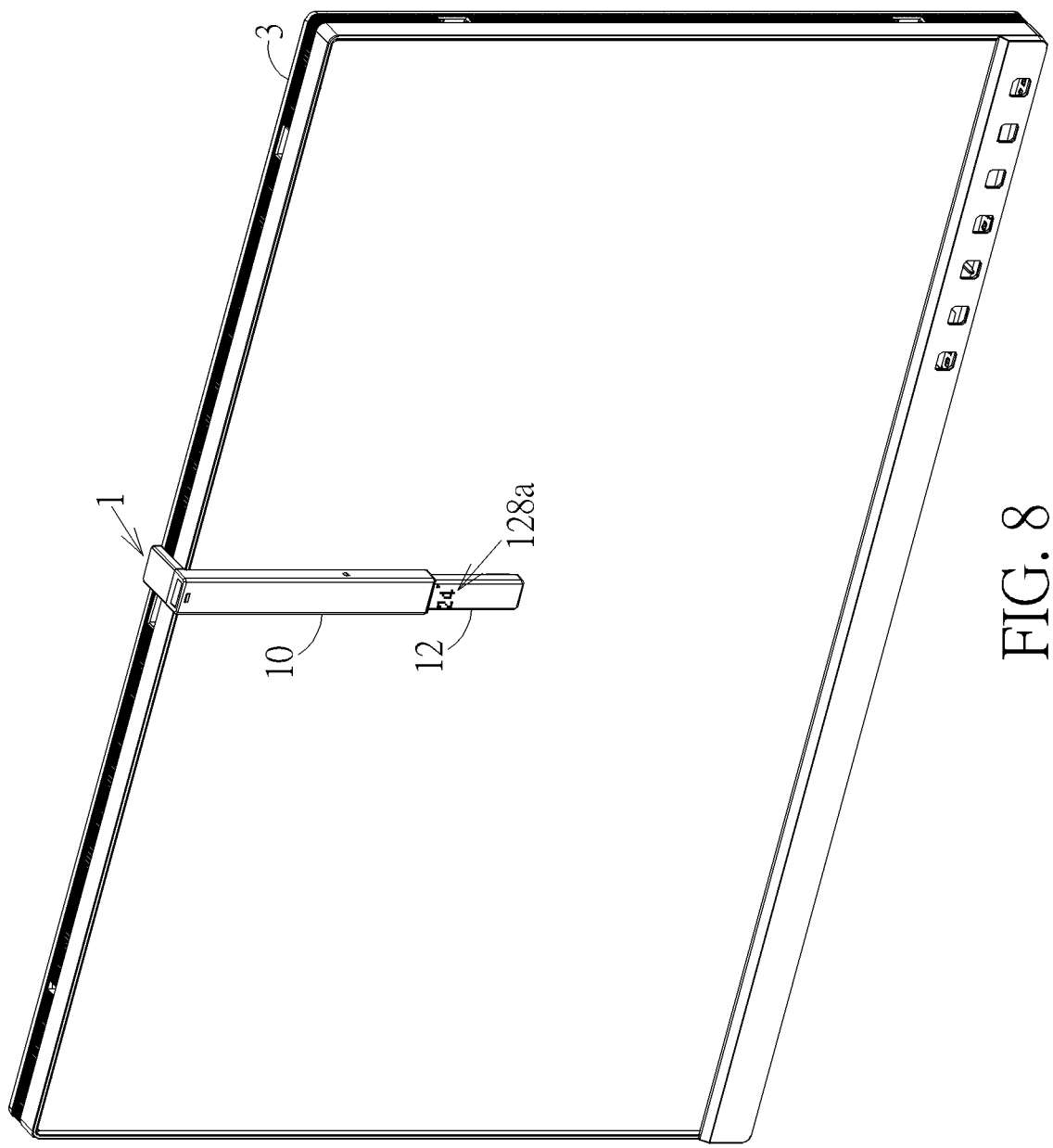
FIG. 8 is a perspective view illustrating that the color calibrator shown in FIG. 6 is hung on an edge of a display device.
Figure 9:
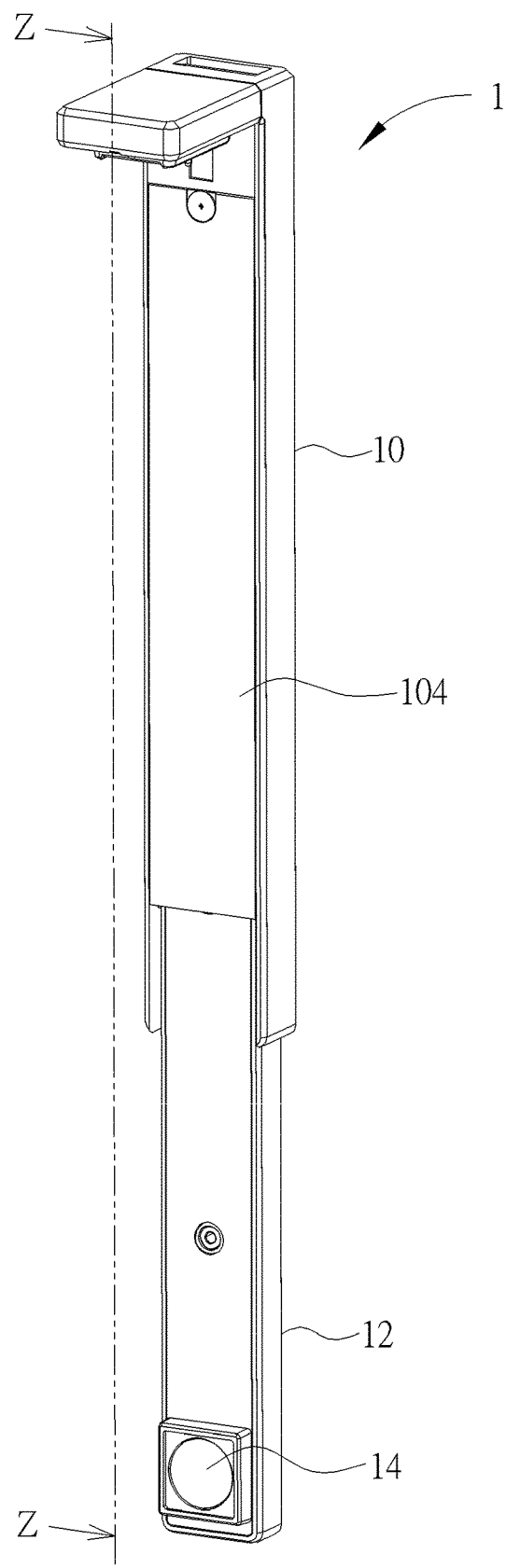
FIG. 9 is another perspective view illustrating that the second casing shown in FIG. 1 protrudes from the first casing.
Figure 10:
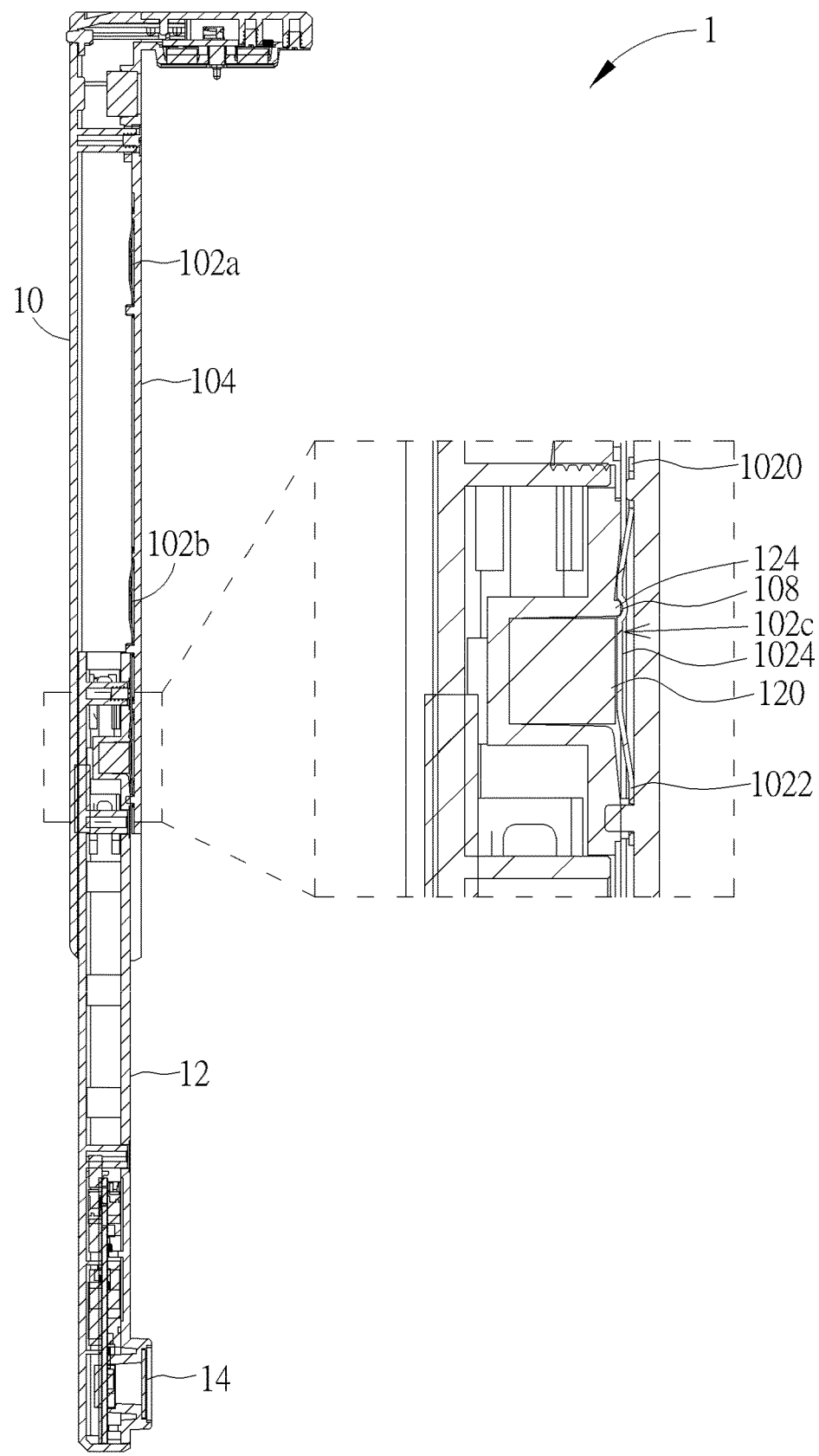
FIG. 10 is a sectional view illustrating the color calibrator shown in FIG. 9.
Figure 11:
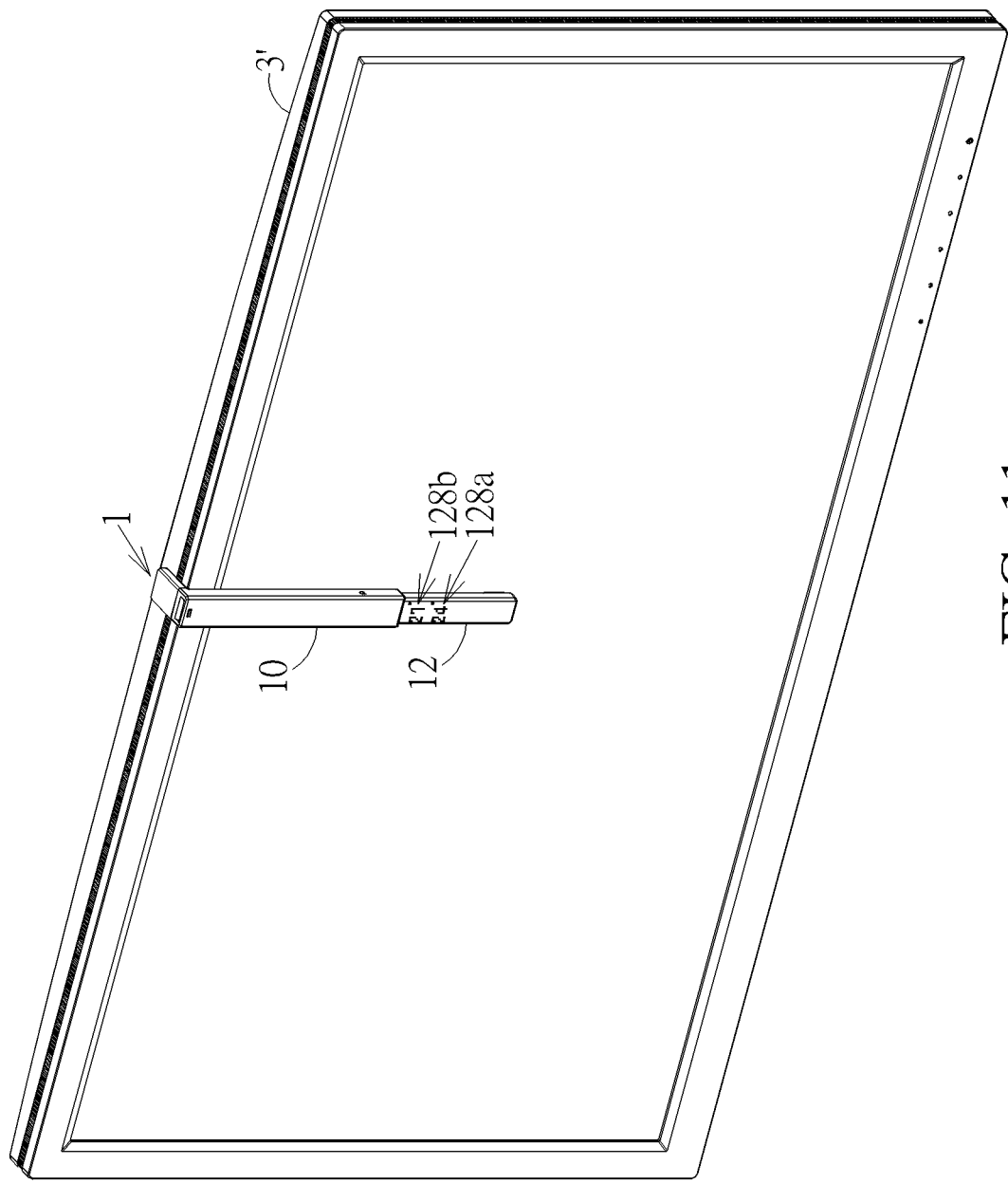
FIG. 11 is a perspective view illustrating that the color calibrator shown in FIG. 9 is hung on an edge of a display device.

Referring to FIGS. 1 to 11, FIG. 1 is a perspective view illustrating a color calibrator 1 according to an embodiment of the invention, FIG. 2 is an exploded view illustrating the color calibrator 1 shown in FIG. 1, FIG. 3 is an exploded view illustrating the color calibrator 1 shown in FIG. 1 from another viewing angle, FIG. 4 is an exploded view illustrating the color calibrator 1 shown in FIG. 1 from another viewing angle, FIG. 5 is a sectional view illustrating the color calibrator 1 shown in FIG. 1 along line X-X, FIG. 6 is a perspective view illustrating that the second casing 12 shown in FIG. 1 protrudes from the first casing 10, FIG. 7 is a sectional view illustrating the color calibrator 1 shown in FIG. 6 along line Y-Y, FIG. 8 is a perspective view illustrating that the color calibrator 1 shown in FIG. 6 is hung on an edge of a display device 3, FIG. 9 is another perspective view illustrating that the second casing 12 shown in FIG. 1 protrudes from the first casing 10, FIG. 10 is a sectional view illustrating the color calibrator 1 shown in FIG. 9 along line Z-Z, and FIG. 11 is a perspective view illustrating that the color calibrator 1 shown in FIG. 9 is hung on an edge of a display device 3'.

As shown in FIGS. 1 to 5, the color calibrator 1 comprises a first casing 10, a second casing 12 and an optical sensor 14. The color calibrator 1 is used to detect a color error of a display device and then generates a setting profile for the display device to modify the color error. The optical sensor 14 is disposed on the second casing 12. In practical applications, the optical sensor 14 may be a colorimeter or other sensors capable of sensing light.

The first casing 10 has an accommodating recess 100 and a plurality of first positioning members 102a, 102b, 102c, wherein the first positioning members 102a, 102b, 102c are arranged along an axial direction D of the accommodating recess 100. In this embodiment, the first casing 10 may further have a cover 104. The cover 104 covers the accommodating recess 100. As shown in FIGS. 2 and 3, opposite sides of the accommodating recess 100 may have a plurality of engaging recesses 1000 and opposite sides of the cover 104 may have a plurality of engaging portions 1040, wherein the engaging portions 1040 correspond to the engaging recesses 1000. The engaging portions 1040 may engage with the engaging recesses 1000 to dispose the cover 104 on the first casing 10. Needless to say, the engaging portions 1040 may also disengage from the engaging recesses 1000 to detach the cover 104 from the first casing 10.

In this embodiment, the first positioning members 102a, 102b, 102c may be disposed on the cover 104. Furthermore, each of the first positioning members 102a, 102b, 102c may have a first fixing portion 1020, a second fixing portion 1022 and a floatable portion 1024. The first fixing portion 1020 and the second fixing portion 1022 are fixed on the cover 104 of the first casing 10, and the floatable portion 1024 is located between the first fixing portion 1020 and the second fixing portion 1022, such that the floatable portion 1024 may float with respect to the cover 104.

The second casing 12 is telescopically disposed in the accommodating recess 100 of the first casing 10. The second casing 12 has a second positioning member 120. The second positioning member 120 is configured to cooperate with one of the first positioning members 102a, 102b, 102c to position the second casing 12 at one of a plurality of telescopic positions with respect to the first casing 10, as shown in FIGS. 5, 7 and 10. For further illustration, the number of the first positioning members is equal to the number of the telescopic positions of the second casing 12. Accordingly, when the first casing 10 has three first positioning members 102a, 102b, 102c, the second casing 12 can be positioned at one of three telescopic positions with respect to the first casing 10. It should be noted that the number of the first positioning members (i.e. the number of the telescopic positions of the second casing 12) may be determined according to practical applications, so the invention is not limited to the embodiment shown in the figures.

In this embodiment, the first positioning members 102a, 102b, 102c may be, but not limited to, magnetic induction materials (e.g. iron plates) and the second positioning member 120 may be, but not limited to, a magnet. In another embodiment, the first positioning members 102a, 102b, 102c may be magnets and the second positioning member 120 may be a magnetic induction material. In another embodiment, all of the first positioning members 102a, 102b, 102c and the second positioning member 120 may be magnets. In other words, one of the first positioning member and the second positioning member may be a magnet, and another one of the first positioning member and the second positioning member may be a magnet or a magnetic induction material according to practical applications. Accordingly, the second positioning member 120 may attract one of the first positioning members 102a, 102b, 102c magnetically, so as to position the second casing 12 at one of the telescopic positions with respect to the first casing 10, as shown in FIGS. 5, 7 and 10.

In this embodiment, the first casing 10 may further have at least one sliding rail 106, wherein the at least one sliding rail 106 is located in the accommodating recess 100. Furthermore, the second casing 12 may further have at least one protruding portion 122. As shown in FIGS. 2 to 4, the first casing 10 may have two sliding rails 106 and the second casing 12 may have six protruding portions 122. When the second casing 12 is disposed in the accommodating recess 100 of the first casing 10, the protruding portions 122 are slidably disposed in the sliding rails 106 correspondingly.

BY means of the arrangement of the protruding portions 122 and the sliding rails 106, the contact area between the first casing 10 and the second casing 12 may be reduced, such that the second casing 12 may slide with respect to the first casing 10 smoothly. It should be noted that the number of the sliding rails and the protruding portions may be determined according to practical applications, so the invention is not limited to the embodiment shown in the figures.

In this embodiment, the first casing 10 may further have a plurality of first engaging portions 108, wherein each of the first engaging portions 108 is disposed with respect to one of the first positioning members 102a, 102b, 102c. For example, when the first positioning members 102a, 102b, 102c are iron plates, each of the first engaging portions 108 may be a recess formed on the iron plate. Furthermore, the second casing 12 may further have a second engaging portion 124, wherein the second engaging portion 124 is disposed with respect to the second positioning member 120. For example, when the first engaging portion 108 is a recess, the second engaging portion 124 may be a protrusion. As shown in FIGS. 5, 7 and 10, when the second casing 12 is positioned at one of the telescopic positions with respect to the first casing 10, the second engaging portion 124 engages with the first engaging portion 108 to further restrain the second casing 12 at the corresponding telescopic position. Still further, when the second casing 12 moves with respect to the first casing 10, the second engaging portion 124 pushes the floatable portion 1024 of the first positioning members 102a, 102b, 102c, such that the first positioning members 102a, 102b, 102c deform elastically. At this time, the second engaging portion 124 disengages from the first engaging portion 108.

In this embodiment, opposite sides of the second casing 12 have a plurality of elastic structures 126, wherein the elastic structures 126 may be, but not limited to, elastic arms. When the second casing 12 is disposed in the accommodating recess 100 of the first casing 10, the elastic structures 126 abut against opposite side walls of the accommodating recess 100. Accordingly, the invention may improve stability as the second casing 12 is moving with respect to the first casing 10. As shown in FIGS. 2 and 3, opposite sides of the second casing 12 may have four elastic structures 126. It should be noted that the number of the elastic structures 126 may be determined according to practical applications, so the invention is not limited to the embodiment shown in the figures.

As shown in FIGS. 6 to 8, a user may slide the second casing 12 of the color calibrator 1 to one of the telescopic positions with respect to the first casing 10 by means of the cooperation between the first positioning member 102b and the second positioning member 120, so as to adjust a length of the color calibrator 1 according to a size of a display device 3. When the user hangs the first casing 10 of the color calibrator 1 on an edge of the display device 3, the optical sensor 14 of the color calibrator 1 can sense a color of a center of the display device 3.

As shown in FIGS. 9 to 11, a user may slide the second casing 12 of the color calibrator 1 to another one of the telescopic positions with respect to the first casing 10 by means of the cooperation between the first positioning member 102c and the second positioning member 120, so as to adjust a length of the color calibrator 1 according to a size of a display device 3'. When the user hangs the first casing 10 of the color calibrator 1 on an edge of the display device 3', the optical sensor 14 of the color calibrator 1 can sense a color of a center of the display device 3'.

In this embodiment, the second casing 12 may further have a plurality of marks 128a, 128b, wherein each of the marks 128a, 128b corresponds to one of the telescopic positions, as shown in FIGS. 8 and 11. When the second casing 12 is positioned at one of the telescopic positions with respect to the first casing 10, the mark 128a, 128b corresponding to the telescopic position is exposed from an end of the first casing 10. The marks 128a, 128b are configured to indicate the size of the display device correspondingly, such that the user may adjust the length of the color calibrator 1 conveniently. For example, the size of the display device 3 shown in FIG. 8 may be 24 inches and the size of the display device 3' shown in FIG. 11 may be 27 inches. Accordingly, when the user wants to use the color calibrator 1 to calibrate a color of the display device 3, the user may move the second casing 12 to the telescopic position corresponding to the mark 128a; and when the user wants to use the color calibrator 1 to calibrate a color of the display device 3', the user may move the second casing 12 to the telescopic position corresponding to the mark 128b.

Figure 12:
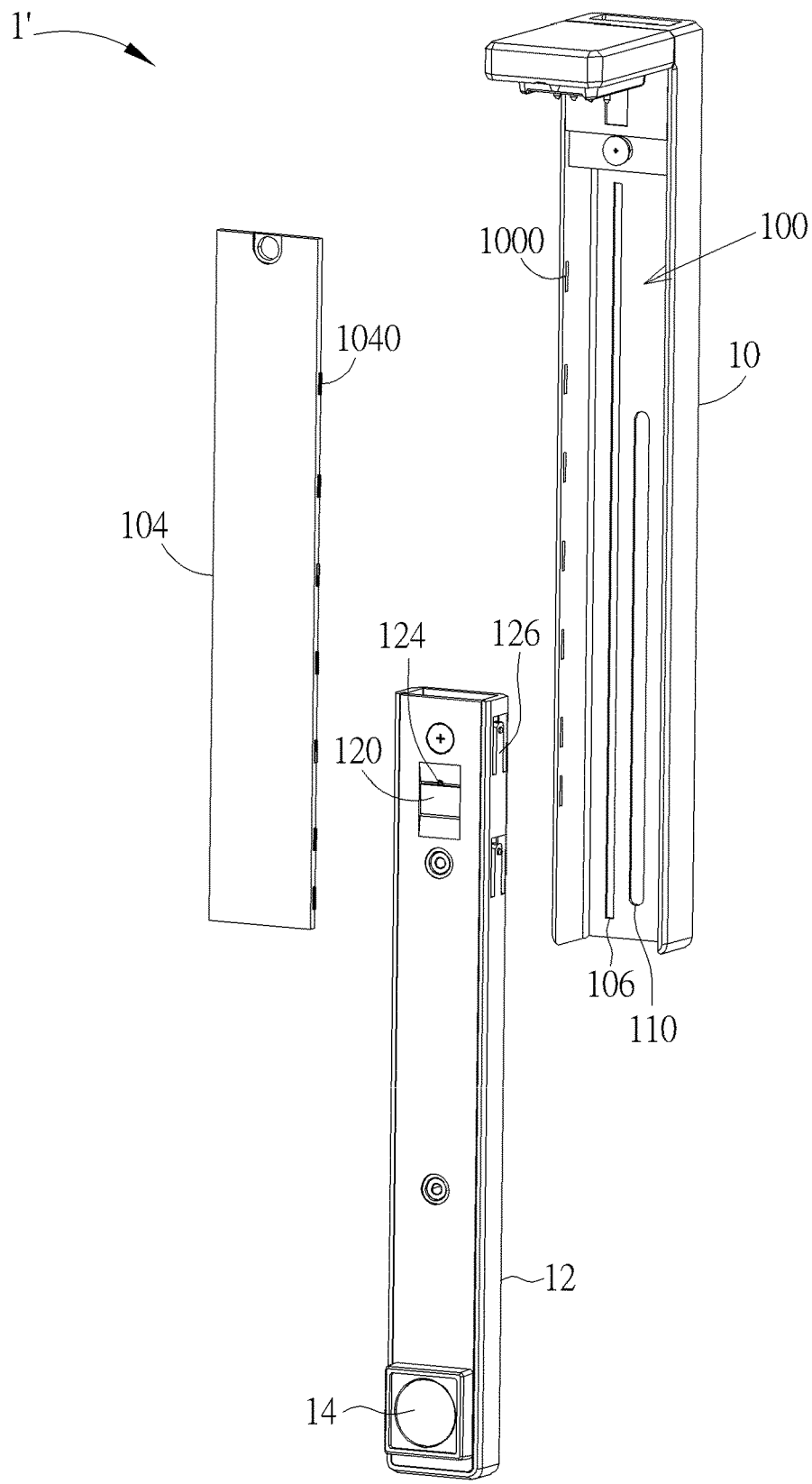
FIG. 12 is an exploded view illustrating a color calibrator according to another embodiment of the invention.
Figure 13:
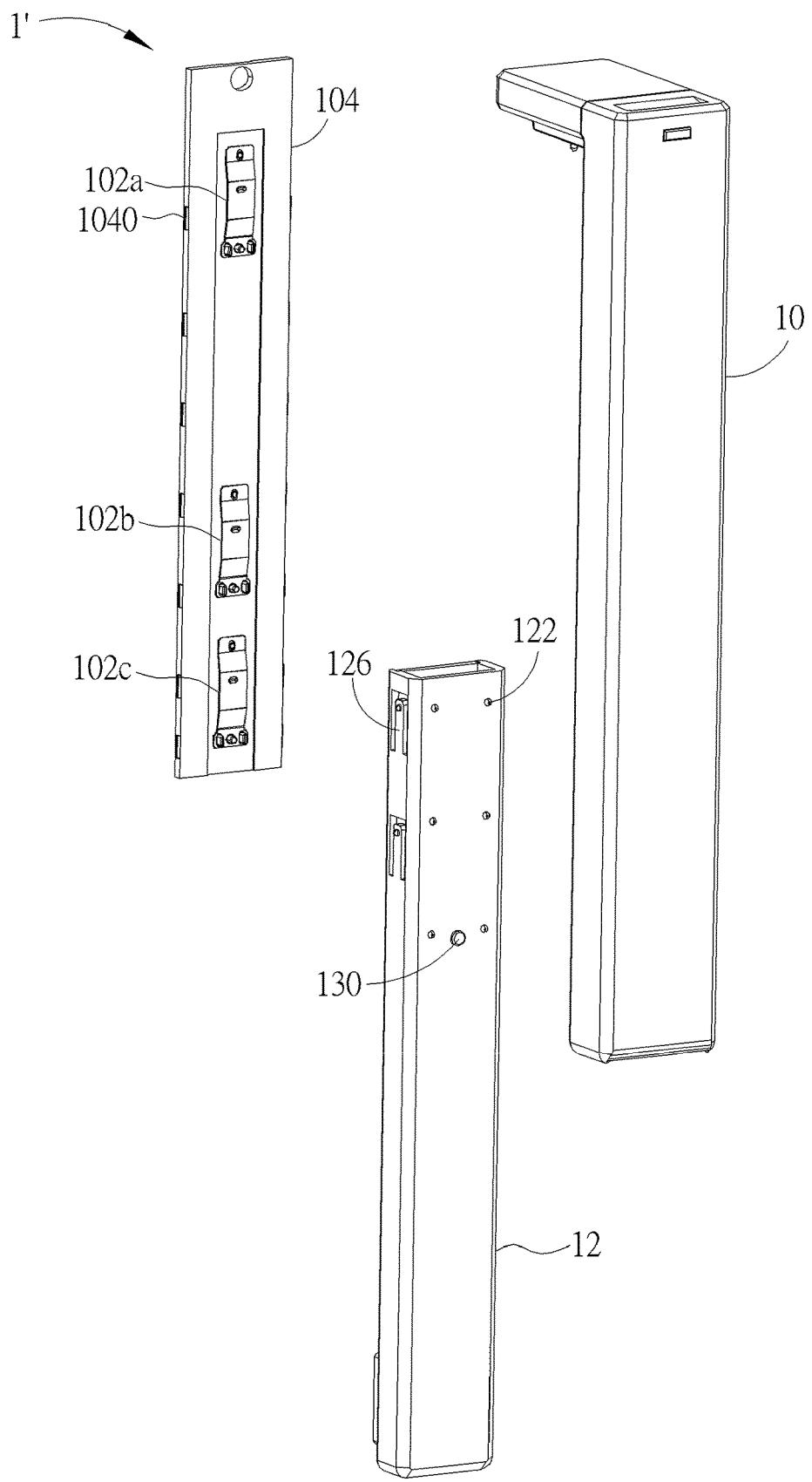
FIG. 13 is an exploded view illustrating the color calibrator shown in FIG. 12 from another viewing angle.
Figure 14:
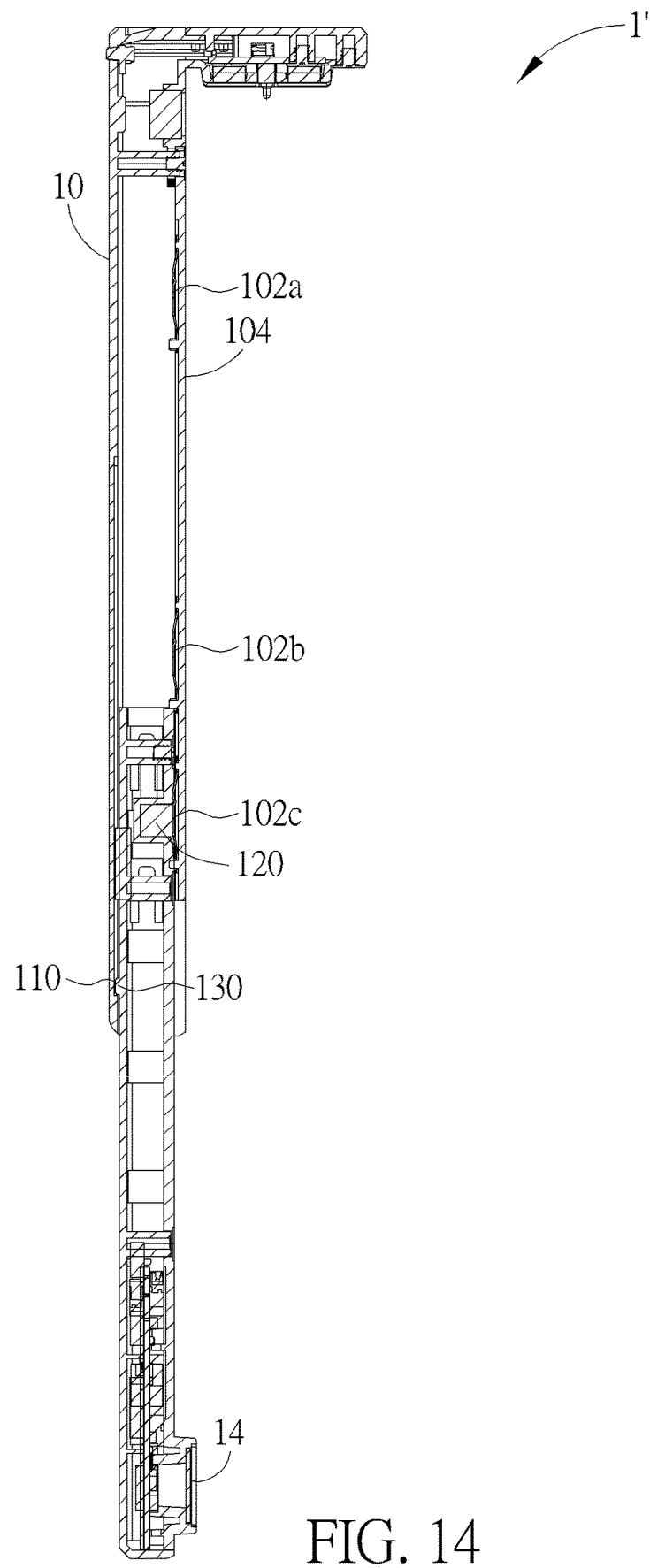
FIG. 14 is a sectional view illustrating an assembly of the color calibrator shown in FIG. 12.

Referring to FIGS. 12 to 14, FIG. 12 is an exploded view illustrating a color calibrator 1' according to another embodiment of the invention, FIG. 13 is an exploded view illustrating the color calibrator 1' shown in FIG. 12 from another viewing angle, and FIG. 14 is a sectional view illustrating an assembly of the color calibrator 1' shown in FIG. 12.

The main difference between the color calibrator 1' and the aforesaid color calibrator 1 is that the first casing 10 of the color calibrator 1' further has a restraining groove 110 and the second casing 12 of the color calibrator 1' further has a restraining portion 130, as shown in FIGS. 12 to 14. When the second casing 12 is disposed in the accommodating recess 100 of the first casing 10, the restraining portion 130 is slidably disposed in the restraining groove 110. Accordingly, when the second casing 12 protrudes from the first casing 10 by a predetermined length, the restraining portion 130 abuts against an end of the restraining groove 110 to prevent the second casing 12 from coming off the first casing 10. In this embodiment, when the second casing 12 protrudes from the first casing 10 by the aforesaid predetermined length, the second positioning member 120 may cooperate with the first positioning member 102c to position the second casing 12 at the telescopic position shown in FIG. 14 with respect to the first casing 10.

As mentioned in the above, a user may slide the second casing of the color calibrator to one of the telescopic positions with respect to the first casing by means of the cooperation between the first positioning members and the second positioning member, so as to adjust a length of the color calibrator according to a size of a display device. When the user hangs the first casing of the color calibrator on an edge of the display device, the optical sensor of the color calibrator can sense a color of a center of the display device. Accordingly, the color calibrator of the invention can be adapted to various display devices with different sizes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A color calibrator comprising:
a first casing having an accommodating recess and a plurality of first positioning members, the first positioning members being arranged along an axial direction of the accommodating recess, the first positioning member having a first fixing portion, a second fixing portion and a floatable portion, the first fixing portion and the second fixing portion being fixed on the first casing, the floatable portion being located between the first fixing portion and the second fixing portion, the first casing further having a plurality of first engaging portions, and each of the first engaging portions being disposed with respect to one of the first positioning members;
a second casing telescopically disposed in the accommodating recess, the second casing having a second positioning member, one of the first positioning member and the second positioning member being a magnet, another one of the first positioning member and the second positioning member being a magnet or a magnetic induction material, the second positioning member cooperating with one of the first positioning members to position the second casing at one of a plurality of telescopic positions with respect to the first casing, the second casing further having a second engaging portion, the second engaging portion being disposed with respect to the second positioning member, the second engaging portion engaging with one of the plurality of first engaging portions when the second casing is positioned at one of the telescopic positions with respect to the first casing, and the second engaging portion pushing the floatable portion, such that the first positioning member deforms elastically when the second casing moves with respect to the first casing; and
an optical sensor disposed on the second casing.

2. The color calibrator of claim 1, wherein the first casing further has at least one sliding rail, the at least one sliding rail is located in the accommodating recess, and the second casing further has at least one protruding portion; when the second casing is disposed in the accommodating recess, the at least one protruding portion is slidably disposed in the at least one sliding rail.

3. The color calibrator of claim 1, wherein opposite sides of the second casing have a plurality of elastic structures; when the second casing is disposed in the accommodating recess, the elastic structures abut against opposite side walls of the accommodating recess.

4. The color calibrator of claim 1, wherein the second casing further has a plurality of marks and each of the marks corresponds to one of the telescopic positions; when the second casing is positioned at one of the telescopic positions with respect to the first casing, the mark corresponding to the telescopic position is exposed from an end of the first casing.

5. The color calibrator of claim 1, wherein the first casing further has a cover, the cover covers the accommodating recess, and the first positioning members are disposed on the cover.

6. The color calibrator of claim 1, wherein the first casing further has a restraining groove and the second casing further has a restraining portion; when the second casing is disposed in the accommodating recess, the restraining portion is slidably disposed in the restraining groove; when the second casing protrudes from the first casing by a predetermined length, the restraining portion abuts against an end of the restraining groove.

7. A color calibrator comprising:
a first casing having an accommodating recess and a plurality of first positioning members, the first positioning members being arranged along an axial direction of the accommodating recess, the first casing further having at least one sliding rail, and the at least one sliding rail being located in the accommodating recess;

a second casing telescopically disposed in the accommodating recess, the second casing having a second positioning member, one of the first positioning member and the second positioning member being a magnet, another one of the first positioning member and the second positioning member being a magnet or a magnetic induction material, the second positioning member cooperating with one of the first positioning members to position the second casing at one of a plurality of telescopic positions with respect to the first casing, the second casing further having at least one protruding portion, and the at least one protruding portion being slidably disposed in the at least one sliding rail when the second casing is disposed in the accommodating recess; and an optical sensor disposed on the second casing.

8. The color calibrator of claim 7, wherein the first casing further has a plurality of first engaging portions, each of the first engaging portions is disposed with respect to one of the first positioning members, the second casing further has a second engaging portion, and the second engaging portion is disposed with respect to the second positioning member; when the second casing is positioned at one of the telescopic positions with respect to the first casing, the second engaging portion engages with one of the plurality of first engaging portions.

9. The color calibrator of claim 7, wherein opposite sides of the second casing have a plurality of elastic structures; when the second casing is disposed in the accommodating recess, the elastic structures abut against opposite side walls of the accommodating recess.

10. The color calibrator of claim 7, wherein the second casing further has a plurality of marks and each of the marks corresponds to one of the telescopic positions; when the second casing is positioned at one of the telescopic positions with respect to the first casing, the mark corresponding to the telescopic position is exposed from an end of the first casing.

11. The color calibrator of claim 7, wherein the first casing further has a cover, the cover covers the accommodating recess, and the first positioning members are disposed on the cover.

12. The color calibrator of claim 7, wherein the first casing further has a restraining groove and the second casing further has a restraining portion; when the second casing is disposed in the accommodating recess, the restraining portion is slidably disposed in the restraining groove; when the second casing protrudes from the first casing by a predetermined length, the restraining portion abuts against an end of the restraining groove.

13. A color calibrator comprising:
a first casing having an accommodating recess and a plurality of first positioning members, the first positioning members being arranged along an axial direction of the accommodating recess;
a second casing telescopically disposed in the accommodating recess, the second casing having a second positioning member, one of the first positioning member and the second positioning member being a magnet, another one of the first positioning member and the second positioning member being a magnet or a magnetic induction material, the second positioning member cooperating with one of the first positioning members to position the second casing at one of a plurality of telescopic positions with respect to the first casing, opposite sides of the second casing having a plurality of elastic structures, and the elastic structures abutting against opposite side walls of the accommodating recess when the second casing is disposed in the accommodating recess; and
an optical sensor disposed on the second casing.

14. The color calibrator of claim 13, wherein the first casing further has a plurality of first engaging portions, each of the first engaging portions is disposed with respect to one of the first positioning members, the second casing further has a second engaging portion, and the second engaging portion is disposed with respect to the second positioning member; when the second casing is positioned at one of the telescopic positions with respect to the first casing, the second engaging portion engages with one of the plurality of first engaging portions.

15. The color calibrator of claim 13, wherein the second casing further has a plurality of marks and each of the marks corresponds to one of the telescopic positions; when the second casing is positioned at one of the telescopic positions with respect to the first casing, the mark corresponding to the telescopic position is exposed from an end of the first casing.

16. The color calibrator of claim 13, wherein the first casing further has a cover, the cover covers the accommodating recess, and the first positioning members are disposed on the cover.

17. The color calibrator of claim 13, wherein the first casing further has a restraining groove and the second casing further has a restraining portion; when the second casing is disposed in the accommodating recess, the restraining portion is slidably disposed in the restraining groove; when the second casing protrudes from the first casing by a predetermined length, the restraining portion abuts against an end of the restraining groove.

18. A color calibrator comprising:
a first casing having an accommodating recess and a plurality of first positioning members, the first positioning members being arranged along an axial direction of the accommodating recess, and the first casing further having a restraining groove;
a second casing telescopically disposed in the accommodating recess, the second casing having a second positioning member, one of the first positioning member and the second positioning member being a magnet, another one of the first positioning member and the second positioning member being a magnet or a magnetic induction material, the second positioning member cooperating with one of the first positioning members to position the second casing at one of a plurality of telescopic positions with respect to the first casing, the second casing further having a restraining portion, the restraining portion being slidably disposed in the restraining groove when the second casing is disposed in the accommodating recess, and the restraining portion abutting against an end of the restraining groove when the second casing protrudes from the first casing by a predetermined length; and
an optical sensor disposed on the second casing.

19. The color calibrator of claim 18, wherein the first casing further has a plurality of first engaging portions, each of the first engaging portions is disposed with respect to one of the first positioning members, the second casing further has a second engaging portion, and the second engaging portion is disposed with respect to the second positioning member; when the second casing is positioned at one of the telescopic positions with respect to the first casing, the second engaging portion engages with one of the plurality of first engaging portions.

20. The color calibrator of claim 18, wherein the second casing further has a plurality of marks and each of the marks corresponds to one of the telescopic positions; when the second casing is positioned at one of the telescopic positions with respect to the first casing, the mark corresponding to the telescopic position is exposed from an end of the first casing.

21. The color calibrator of claim 18, wherein the first casing further has a cover, the cover covers the accommodating recess, and the first positioning members are disposed on the cover.

* * * * *